US011834740B2

(12) United States Patent
Marquardt

(10) Patent No.: US 11,834,740 B2
(45) Date of Patent: Dec. 5, 2023

(54) APPARATUS, SYSTEM, AND METHOD FOR GENERATING GAS FOR USE IN A PROCESS CHAMBER

(71) Applicant: Applied Materials, Inc., Santa Clara, CA (US)

(72) Inventor: David Marquardt, Tempe, AZ (US)

(73) Assignee: Applied Materials, Inc., Santa Clara, CA (US)

(*) Notice: Subject to any disclaimer, the term of this patent is extended or adjusted under 35 U.S.C. 154(b) by 414 days.

(21) Appl. No.: 17/094,208

(22) Filed: Nov. 10, 2020

(65) Prior Publication Data
US 2022/0145454 A1 May 12, 2022

(51) Int. Cl.
C23C 16/40 (2006.01)
C23C 16/448 (2006.01)
C23C 16/455 (2006.01)
B01J 7/00 (2006.01)

(52) U.S. Cl.
CPC ............... *C23C 16/448* (2013.01); *B01J 7/00* (2013.01); *C23C 16/455* (2013.01); *B01J 2208/0061* (2013.01); *B01J 2208/00539* (2013.01); *B01J 2208/00884* (2013.01)

(58) Field of Classification Search
CPC ........ C23C 16/45544; C23C 16/45512; C23C 16/45561; C23C 16/303; C23C 16/4482; C23C 16/52; C23C 16/4408; C23C 16/45525; C23C 16/4583; C23C 16/448; C23C 16/455; C23C 16/4481; C30B 25/08; C30B 29/403; C30B 25/14; C30B 25/165; G01F 23/0007; G01F 23/04; B01J 4/008; B01J 7/00; B01J 2208/00539; B01J 2208/0061; B01J 2208/00884; B67D 7/3263; B67D 7/0238
USPC ...................... 118/723 VE, 726; 156/345.29
See application file for complete search history.

(56) References Cited

U.S. PATENT DOCUMENTS

| | | | |
|---|---|---|---|
| 4,904,419 A * | 2/1990 | Reynolds ............ | C23C 16/4482 261/121.1 |
| 6,424,800 B1 * | 7/2002 | Kim .................... | C23C 16/4481 118/724 |
| 10,385,452 B2 * | 8/2019 | Hendrix ................. | B01B 1/005 |
| 10,392,700 B2 * | 8/2019 | Baum ................. | C23C 16/4483 |
| 10,465,286 B2 * | 11/2019 | Gregg ................. | C23C 16/4481 |
| 10,895,010 B2 * | 1/2021 | Cleary ............. | C23C 16/45544 |
| 11,136,169 B2 * | 10/2021 | Chatterton ............ | B65D 55/02 |
| 2006/0169411 A1 * | 8/2006 | Han .................... | C23C 16/4412 156/345.29 |
| 2008/0014350 A1 * | 1/2008 | Carlson ............... | C23C 16/4482 118/733 |

(Continued)

*Primary Examiner* — Rudy Zervigon
(74) *Attorney, Agent, or Firm* — PATTERSON + SHERIDAN LLP

(57) ABSTRACT

Embodiments described herein generally relate to apparatus having a canister with a sidewall, a top, and a bottom forming a canister volume. An inlet line and an outlet line is coupled to the top and is in fluid communication with the canister volume. A plate disposed within the canister volume forms a headspace volume below the plate. Each of the inlet line and the outlet line is in fluid communication with the headspace volume. The apparatus includes standoffs extending from a lower surface of the plate. The standoffs include a lower surface area substantially parallel with the plate.

14 Claims, 5 Drawing Sheets

(56) References Cited

U.S. PATENT DOCUMENTS

| | | | | |
|---|---|---|---|---|
| 2008/0191153 | A1* | 8/2008 | Marganski | C23C 14/564 |
| | | | | 134/107 |
| 2008/0202426 | A1* | 8/2008 | Suzuki | C23C 16/4481 |
| | | | | 118/726 |
| 2009/0181168 | A1* | 7/2009 | Chaubey | C23C 16/4481 |
| | | | | 118/725 |
| 2010/0119734 | A1* | 5/2010 | Choi | C23C 16/4481 |
| | | | | 118/724 |
| 2010/0255198 | A1* | 10/2010 | Cleary | C23C 16/4402 |
| | | | | 427/255.39 |
| 2012/0266967 | A1* | 10/2012 | Kanjolia | C23C 16/4483 |
| | | | | 137/1 |
| 2014/0041590 | A1* | 2/2014 | Jang | C23C 16/4481 |
| | | | | 118/726 |
| 2014/0174955 | A1* | 6/2014 | Sasagawa | C23C 16/4481 |
| | | | | 206/0.6 |
| 2015/0191819 | A1* | 7/2015 | Hendrix | C23C 16/4402 |
| | | | | 118/728 |
| 2016/0017489 | A1* | 1/2016 | Koller | C23C 16/4482 |
| | | | | 261/153 |
| 2017/0107617 | A1* | 4/2017 | Gatineau | C23C 16/50 |
| 2017/0107618 | A1* | 4/2017 | Gatineau | C23C 16/4481 |
| 2017/0298507 | A1* | 10/2017 | Lee | H01L 21/0228 |
| 2017/0306485 | A1* | 10/2017 | Lee | C23C 16/405 |
| 2019/0055649 | A1* | 2/2019 | Lee | H01L 21/02175 |
| 2019/0161358 | A1* | 5/2019 | Sanchez | H01L 21/02274 |
| 2020/0362456 | A1* | 11/2020 | Nakagawa | C23C 16/4481 |
| 2020/0370172 | A1* | 11/2020 | Moriya | H01L 21/31138 |
| 2021/0147977 | A1* | 5/2021 | Hendrix | C23C 16/4581 |
| 2022/0064786 | A1* | 3/2022 | Itsuki | C23C 16/4404 |
| 2022/0090261 | A1* | 3/2022 | Itsuki | C25F 3/16 |
| 2022/0145454 | A1* | 5/2022 | Marquardt | B01J 7/00 |
| 2022/0403512 | A1* | 12/2022 | White | C23C 16/4482 |

\* cited by examiner

APPARATUS, SYSTEM, AND METHOD FOR GENERATING GAS FOR USE IN A PROCESS CHAMBER

BACKGROUND

Field

Embodiments of the present disclosure relate to an apparatus, system, and method for generating gas for use in a process chamber.

Description of the Related Art

Electronic device manufacturing systems include one or more process chambers configured to perform any number of substrate processes including, e.g., degassing, pre-cleaning or cleaning, deposition, coating, oxidation, nitration, etching (e.g., plasma etching), and the like. Substrates that may be processed include semiconductor wafers, glass plates or panels, and/or other workpieces used to make electronic devices or circuit components.

Chemical vapor deposition (CVD) and atomic layer deposition (ALD) are two deposition processes used to form or deposit various materials on substrates. In general, CVD and ALD processes involve the delivery of gaseous reactants to the substrate surface where a chemical reaction takes place under temperature and pressure conditions favorable to the thermodynamics of the reaction.

Many such deposition processes use a heated vessel or canister, such as an ampoule or bubbler. The vessel or canister contains a solid and/or liquid precursor under conditions conducive to vaporize the precursor and deliver the vaporized precursor to the substrate disposed in the process chamber. A carrier gas is introduced to the ampoule and passes across the surface of the precursor bed to deliver the vaporized precursor from the ampoule to the process chamber. As the solid and/or vapor precursor is consumed, the dosage of gas delivered to the substrate is reduced.

Accordingly, there is a need for apparatuses, systems, and methods generating gas for use in a process chamber with uniform dosage overtime.

SUMMARY

In one embodiment, an apparatus is provided having a canister with a sidewall, a top, and a bottom forming a canister volume. An inlet line and an outlet line is coupled to the top and is in fluid communication with the canister volume. A plate disposed within the canister volume forms a headspace volume below the plate. Each of the inlet line and the outlet line is in fluid communication with the headspace volume. The apparatus includes standoffs extending from a lower surface of the plate. The standoffs include a lower surface area substantially parallel with the plate.

In another embodiment, a system is provided for generating a process gas used in a vapor deposition processing system. The vapor deposition processing system includes a canister having a sidewall, a top, and a bottom forming a canister volume. An inlet line and an outlet line is coupled with and in fluid communication with the canister volume. A plate is disposed within the canister volume forming a headspace volume below the plate. The inlet line and the outlet line are each in fluid communication with the headspace volume. A solid precursor material is at least partially contained within a lower region of the canister volume disposed below the headspace volume. One or more standoffs extend from a lower surface of the plate. The one or more standoffs include a lower surface area substantially parallel with the plate.

In yet another embodiment, a method is provided for generating a process gas used in a vapor deposition processing system. The method includes introducing a solid precursor material into a lower region of the canister volume of a canister, the canister having a top, a sidewall, and a bottom. A gas from an inlet line is introduced to a headspace volume of the canister. The headspace volume is disposed below a plate disposed within the canister volume and above the lower region of the canister volume. Process gas is removed from the headspace volume of the canister through an outlet line of the headspace. As the process gas is removed, the plate is lowered from a first height to a second height. The lowering of the plate corresponds to reducing a level of the solid precursor material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a canister with solid precursor material disposed therein. A plate is positioned above the solid precursor within the canister and is lowered at the same rate the bed of solid precursor level is lowered during consumption. The plate maintains a fixed height of headspace above the solid precursor that enables uniform carrier gas flow across the surface of the precursor to provide uniform dosage of volatile gases that is delivered from the canister (e.g., ampoule) to the process chamber (e.g., CVD chamber). The plate is further coupled to a linear actuator and a sensor is coupled to linear actuator to detect a position of a piston within the linear actuator. The piston position is indicative of the level of the solid precursor within the canister and enables refilling solid precursor into the canister at a threshold "low" level.

Figure 1A:
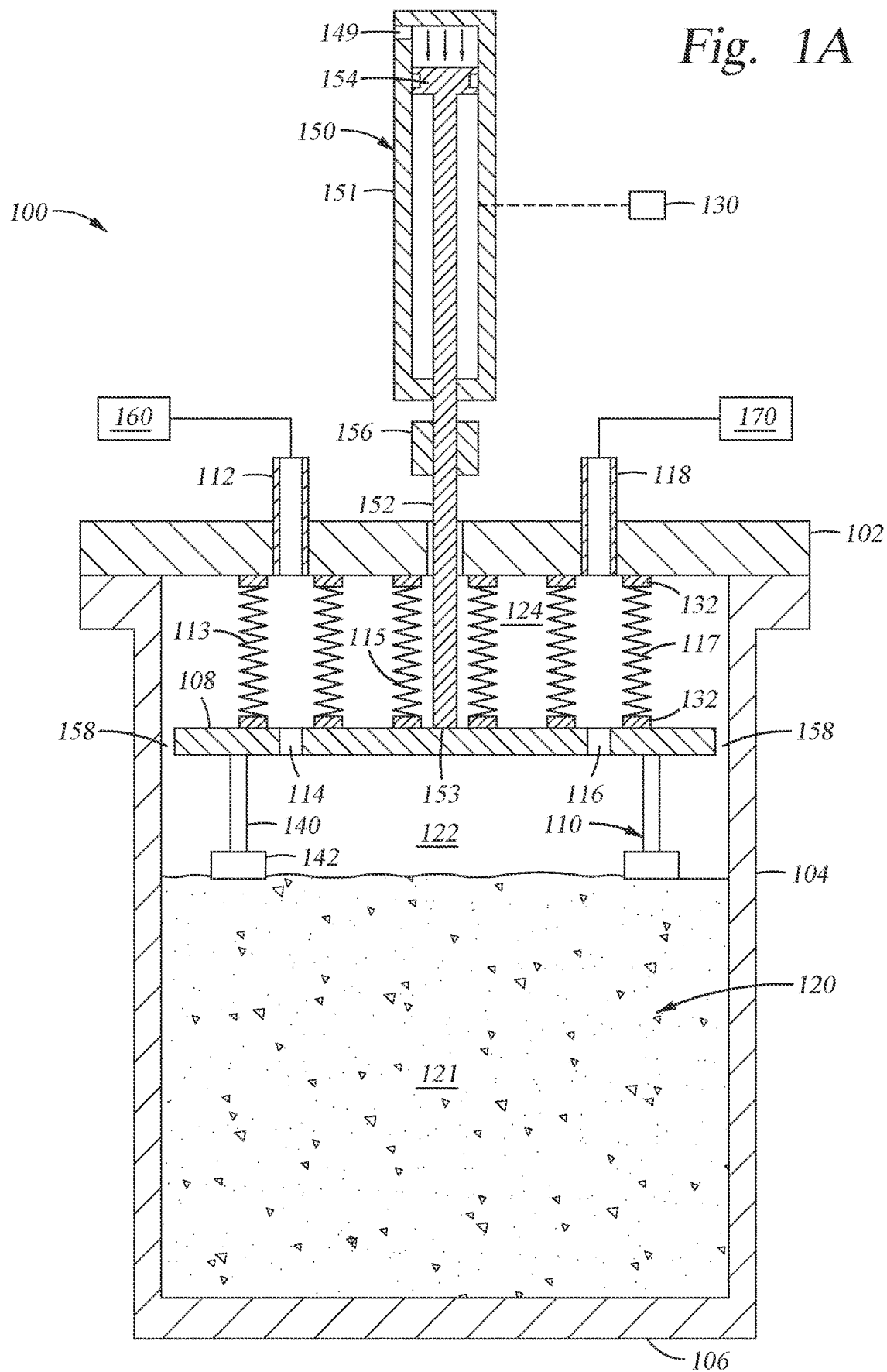
FIG. 1A illustrates a schematic cross-sectional side view of a substantially full canister, according to an embodiment.
Figure 1B:
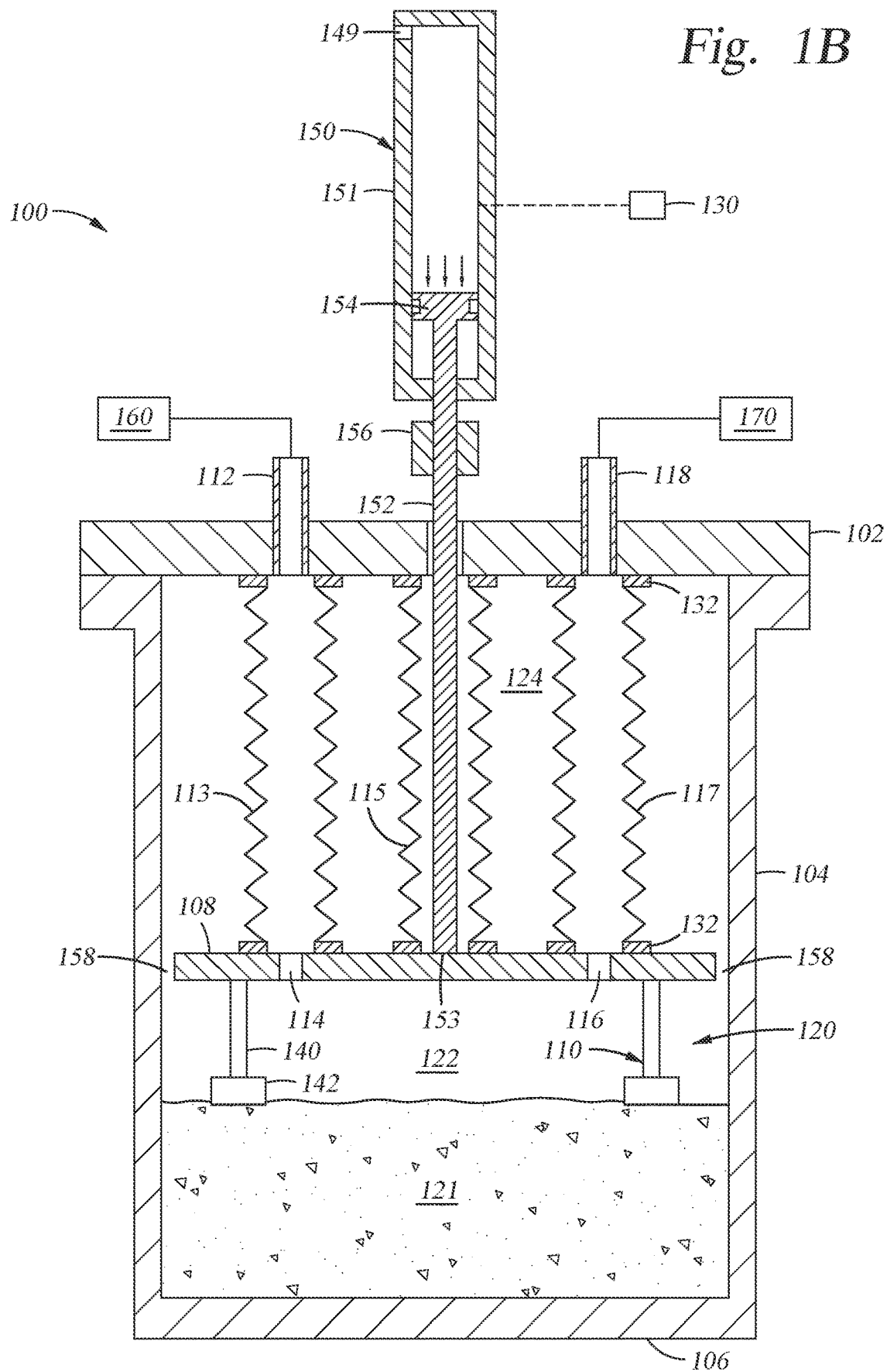
FIG. 1B illustrates a schematic cross-sectional side view of a partially depleted canister, according to an embodiment.

FIGS. 1A and 1B illustrate schematic cross-sectional side views of a substantially full canister 100 and a partially consumed canister 100. An inlet line 112 of the canister 100 is coupled to a carrier gas source 160 and an outlet line 118 is coupled to a process chamber 170. The canister 100 is a sealed container that is configured to hold precursor bed 121, such as metal chlorides, such as hafnium chloride. In some embodiments, which can be combined with other embodiments described herein, the precursor bed is selected from metal oxy-chloride, oxy-chloride, metal organic materials, or combination(s) thereof. The precursor bed 121 is a solid and/or liquid form and is converted to a process gas generated through sublimation and/or vaporization.

The canister 100 includes a top 102, a sidewall 104, and bottom 106. Although the canister 100 is depicted as cylindrical in shape, any suitable geometric form is contemplated such as shapes that include one or more sidewalls, such as a hollow rectangular tube. The interior surface of the canister 100 is substantially unreactive and/or substantially inert to carrier gas introduced from the inlet line 112, the precursor bed 121, and gas produced therefrom. The material of construction is stainless steel, polytetrafluoroethylene, elastomeric, such as fluoroelastomers or perfluoroelastomers, alloy, such as high nickel alloy, and combination(s) thereof. The interior surface of the canister is coated or uncoated with an anti-corrosive film. The top 102 is coupled to the sidewall 104 by mechanical coupling such as mechanical fasteners, clamps, or other leak-tight method. A joint between the sidewall 104 and top 102 includes a seal, o-ring, gasket, or the like, disposed therebetween to prevent leakage from the canister 100. In some embodiments, which can be combined with other embodiments described herein, a flange is welded to the sidewall 104. The flange includes tapped holes and the top 102 is fitted through the holes and held together with bolts or other fasteners.

Figure 1C:
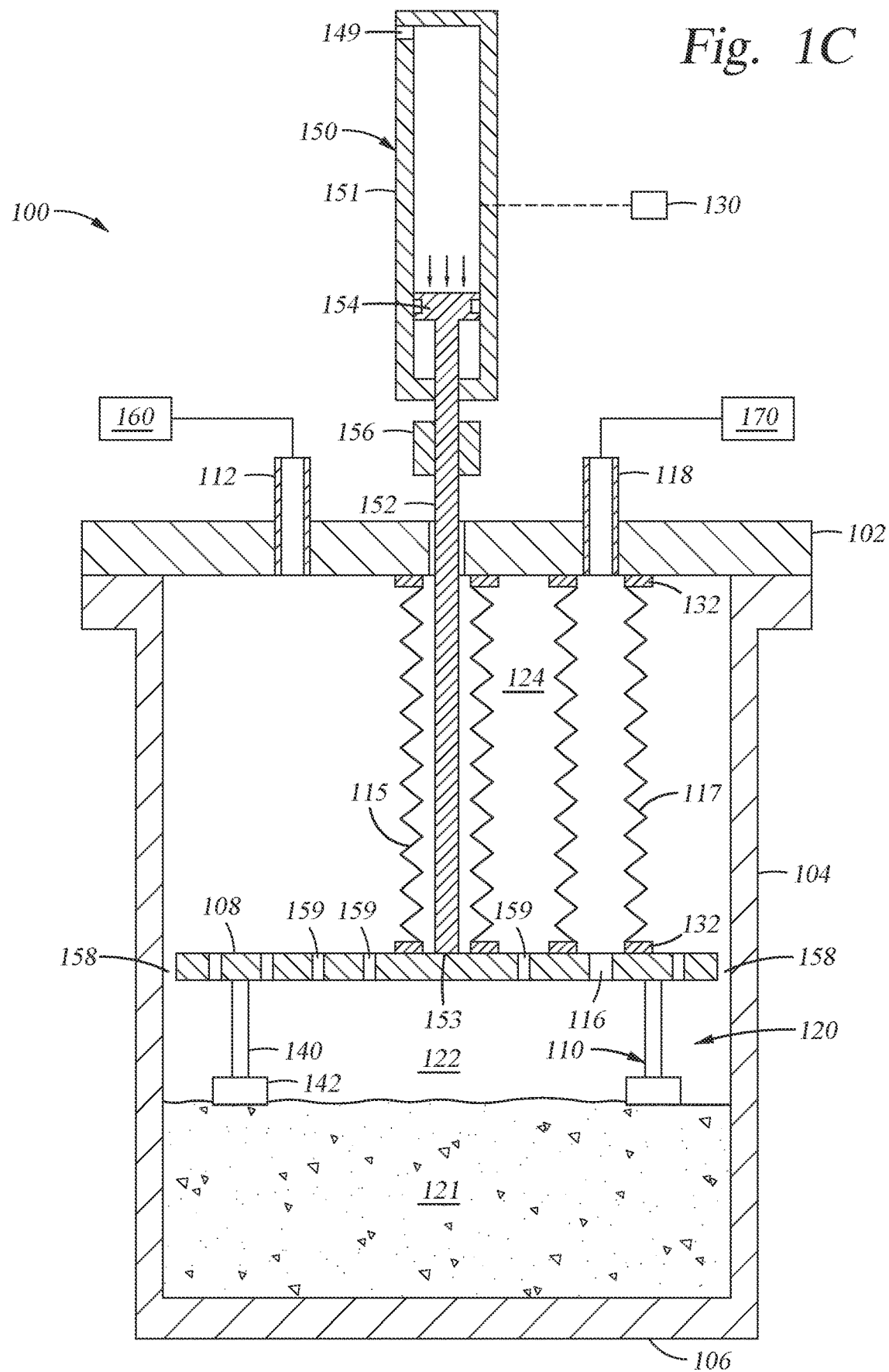
FIG. 1C illustrates a schematic cross-sectional side view of a canister without an inlet bellow, according to embodiment.

A plate 108 is disposed within the canister 100. The plate 108 is sized and shaped to fit within the inner circumference (or inner perimeter) of the sidewall 104 of the canister 100. In some embodiments, which can be combined with other embodiments described herein, the cross-sectional shape from a top view of the plate 108 is a circle. In some embodiments, which can be combined with other embodiments described herein, the canister 100 is about 1.2 L vessel or greater, such as a 1.9 L and the plate 108 has a diameter of about 5 inches to about 6 inches. Other dimensions, both larger and smaller, are also contemplated. The plate 108 separates an upper volume 124 and a lower volume 120 of the canister 100. The lower volume 120 includes a headspace volume 122, and the precursor bed (e.g., 121). The plate 108 is substantially solid. Alternatively the plate 108 includes one or more holes 159 to allow gas to enter the headspace volume 122 from the upper volume 124 such as for embodiments without an inlet bellow as shown in FIG. 1C. The one or more holes 159 of the plate 108 are sized to enable uniform flow into the headspace volume 122. Additionally or alternatively, an annular space 158 between the outer edge of the plate 108 and the sidewall 104 is provided to allow gases to flow into the headspace volume 122. The annular space 158 is sized to provide a flow resistance configured to enable uniform flow to the headspace volume 122.

The plate 108 includes standoffs 110 having a post 140 and a foot 142 extending from a lower surface of the plate 108. The standoffs 110 are configured to space the plate 108 away from the precursor bed 121 and maintain a fixed headspace volume 122. In some embodiments, which can be combined with other embodiments described herein, the headspace volume 122 remains fixed during all stages of processing. Although only two standoffs 110 are depicted in the drawings, one or more standoffs, such as about 1 to about 9 standoffs 110, or about 3 to about 7 standoffs 110 are contemplated. The standoffs 110 are disposed about the peripheral portion of the plate, and/or the standoffs 110 are disposed about the central portion of the plate 108. Each of the feet 142 of the standoffs 110 are configured to contact a surface of the precursor bed 121. In some embodiments, which can be combined with other embodiments described herein, a surface of the foot 142 has a cross-sectional area greater than at least one cross-sectional area of the post 140. Alternatively, the post 140 and foot 142 have the same cross-sectional area. The post 140 and foot 142 are integral (e.g., monolithic) with respect to one another, or the foot is fixed to the post 140 using any suitable method of joining metal. The standoffs 110 and the plate 108 are integral (e.g., monolithic) with respect to one another, or are fixed to one another using any suitable method of joining metal. Any size, number, and shape of the standoffs 110 are contemplated such that a bottom surface of each standoff 110 is configured to have a surface area sufficient to maintain adequate contact with the precursor bed 121 and a corresponding contact pressure to avoid submerging the standoff 110 into the precursor bed 121 and reducing the headspace volume 122.

The plate 108 is coupled to a force mechanism 150. In some embodiments, which can be combined with other embodiments described herein, the force mechanism 150 is an actuator such as a pneumatic linear actuator, or a hydraulic linear actuator. The force mechanism 150 is a double acting cylinder to apply mechanical force and position control of the plate 108. The force that is applied can be any force, such as a constant or variable force from springs, magnets, gravitational, or pneumatic energy to transmit an axial force to a coupler, such as a mechanical link. In some embodiments, which can be combined with other embodiments described herein, the application of force from the force mechanism 150 is monitored using in-line load cells. In some embodiments, which can be combined with other embodiments described herein, an attribute of the force mechanism is monitored, such as a position of the coupler is measured using any known method of monitoring coupler position, such as discrete switches, and analog position measuring devices. The attribute, such as the position of the coupler, is indicative of a level of the solid precursor bed 121.

Figure 1D:
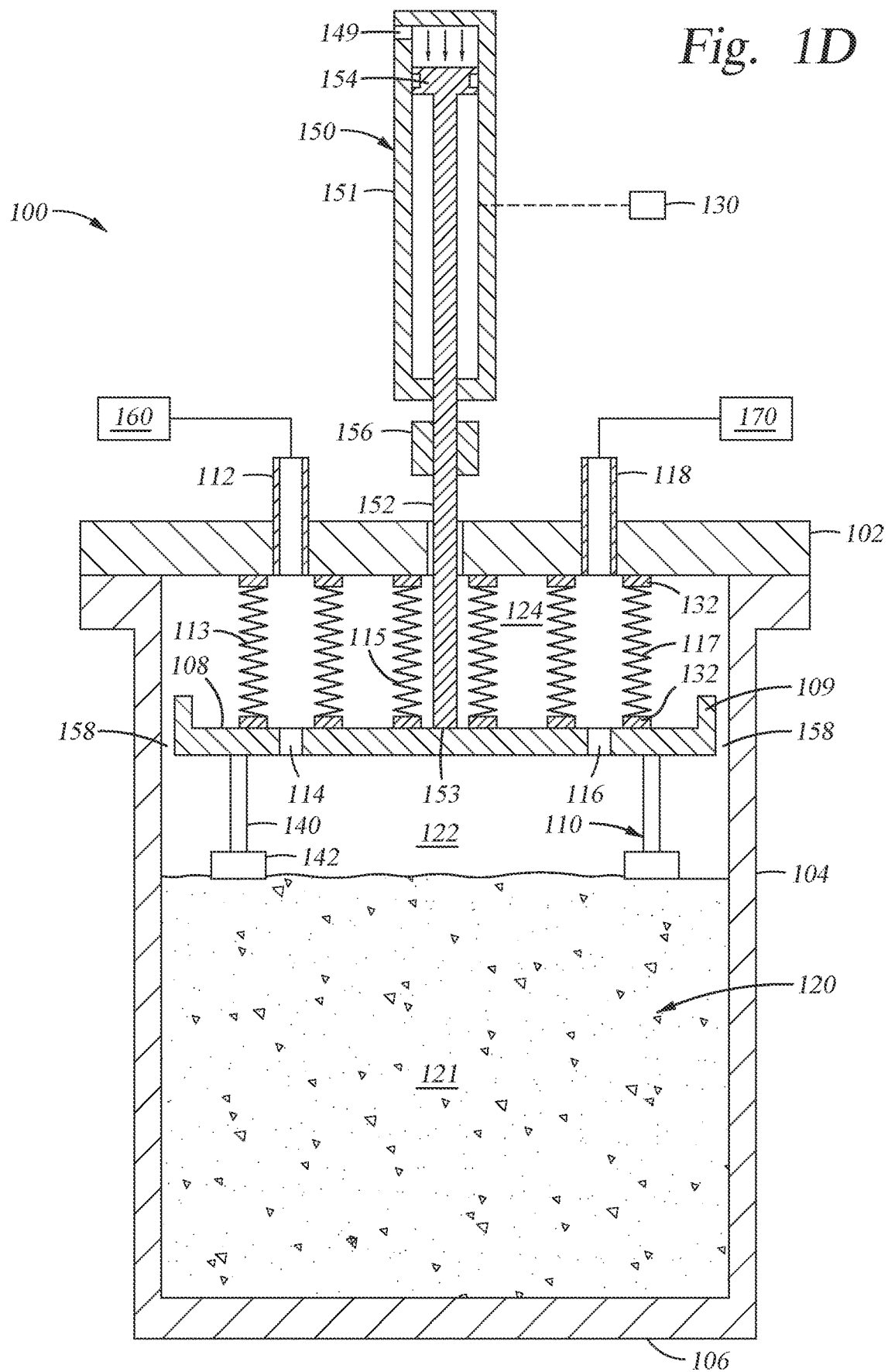
FIG. 1D illustrates a schematic cross-sectional side view of a canister with a plate stabilizer, according to embodiment.

In some embodiments, which can be combined with other embodiments described herein, the force mechanism 150 is a linear actuator and includes a housing 151, a rod 152 and a piston 154. The rod 152 is coupled to the piston 154 on a proximate end and to the plate 108 to a distal end 153 of the rod 152. The distal end 153 of the rod 152 is welded to the plate 108 to stabilize the plate 108 and maintain the plate 108 substantially parallel to the top 102. The rod 152 extends from the housing 151 through an opening in the top 102, through a support bellow 115, to the plate 108. In some embodiments, which can be combined with other embodiments described herein, a bushing 156 the rod 152 to stabilize the rod 152 and the plate 108, such as prevent from tilting (e.g., axial misalignment). Additionally, or alternatively, a stabilizer 109 (e.g., a cylindrical ledge or lip) extending upward from the outer circumference of the plate 108 is used to prevent the plate 108 from tilting, as shown in FIG. 1D.

A vent hole 149 is disposed in the housing 151 to prevent hydraulic lock. A force in a direction toward the precursor bed 121 is applied to the piston 154, which applies to the plate 108. Although the figures depict the piston 154 moving along a vertical axis, other axes are also possible such that the force mechanism 150 is configured to move the plate in opposing directions along the reference axis. Additionally, the description and figures depict the force mechanism 150 as a linear actuator, however, similar principles are applicable for any force mechanisms 150 contemplated, such as the use of monitoring a position of a coupler to determine position of the plate 108. The force applied by the force mechanism 150 is illustrated to be applied toward the precursor bed 121, however, an opposite force can be applied by the force mechanism away from the precursor bed 121, such as to re-establish a reference position of the plate 108. Without being bound by theory, it is believed that the morphology of the precursor bed 121 can be affected such as by uneven consumption during reaction processes, thus, it is has been found that the force mechanism 150 is configured to adjust the plate 108 to re-establish a reference position of the plate 108 and/or a headspace.

The plate 108 is lowered when the downward force exceeds an opposing resistive force applied to the standoffs 110 from the precursor bed 121. In operation, as the precursor bed 121 is consumed, the resistive force is reduced and exceeded by the downward force from the piston 154. Additionally, or alternatively, the downward force is sufficient to maintain contact between the foot 142 of each of the standoffs 110 to the surface of the precursor bed 121. Accordingly, the plate 108 is lowered as the precursor bed 121 is lowered.

A level detector 130 determines an attribute of the force mechanism 150 which corresponds to a level of the precursor bed 121 within the canister 100. In some embodiments, which can be combined with other embodiments described herein, the force mechanism 150 is an actuator and the level detector 130 determines a position of the piston 154 within the housing 151. The level detector 130 is any suitable sensor configured to detect a position of an object from outside of the housing 151, such as a magnetic sensor, or an ultrasonic sensor. Traditionally, determining a level of the precursor bed within a conventional canister is challenging to accomplish accurately. The assembly provided herein with the level detector 130 coupled to the force mechanism 150 provides an accurate method of determining a level of the solid precursor bed 121. Accurate level determination facilitates whether to replace the solid precursor bed 121 within the canister 100. Thus, efficiency is improved as well as increased overall throughput of devices being processed in the process chamber 170.

The inlet line 112 and the outlet line 118 are fluidly coupled to the canister 100 to allow gas flow into and out of the canister 100. The inlet line 112 and the outlet line 118 are each coupled to the top 102 and/or sidewall 104 of the canister 100 and are sealable to allow the interior of the canister 100 to be isolated from the surrounding environment during removal of the canister 100 from the gas delivery system (not shown). The inlet line 112 provides carrier gas from the gas source 160 to a headspace volume 122 of the canister 100 disposed below the plate 108. The inlet line 112 is in fluid communication with the headspace volume 122 via an expandable device, such as an inlet bellow 113. The inlet bellow 113 is coupled to the top 102 and to the plate 108 using a fastener, such as bolt, and/or the inlet bellow 113 is coupled to the top 102 and to the plate 108 by welding. The inlet line 112 is in fluid communication with the headspace volume 122 through the inlet bellow 113 and through an inlet opening 114 of the plate 108. In some embodiments, which can be combined with other embodiments described herein, the inlet line 112 is in fluid communication with the upper volume 124. As shown in FIG. 1C, the gas from the upper volume 124 flows into the headspace volume 122 through the annular space 158 and/or the one or more holes 159 disposed in the plate 108. The embodiment depicted in FIG. 1C is free of an inlet bellow 113.

The outlet line 118 provides process gases formed in the headspace volume 122 of the canister 100 to the process chamber 170. The outlet line 118 is in fluid communication with the headspace volume 122 via an expandable device, such as an outlet bellow 117 and through an outlet opening 116 of the plate 108. The outlet bellow 117 is coupled to the top 102 and to the plate 108 using a fastener 132, such as bolt, and/or the outlet bellow 117 is coupled to the top 102 and to the plate 108 by welding. Each of the plate 108, the inlet bellow 113, the outlet bellow 117, support bellow 115, the standoffs 110, and/or the rod 152 is constructed from stainless steel, polytetrafluoroethylene, nickel, chromium, molybdenum, combination(s) thereof, and alloy(s) thereof. In some embodiments, which can be combined with other embodiments described herein, the bellows are polytetrafluoroethylene coated. Each of the bellows 113, 117, 115 are spring loaded and are capable of compressing when the canister 100 is full (as shown in FIG. 1A) and are capable of expanding as the precursor bed 121 is consumed (as shown in FIG. 1B). The bellows 113, 117, 115 include o-rings or seals at mating interfaces to maintain a vacuum integrity of the canister 100. In some embodiments, which can be combined with other embodiments described herein each bellow includes a diameter of about 2 inches. The vacuum pressure of the canister 100 is about 6 Torr to about 20 Torr, such as about 10 Torr to about 15 Torr. The headspace volume 122 is maintained within about 0% to about 10%, such as about 1% to about 7%, such as about 3% of the headspace volume 122 at any given time during operation.

Figure 2:
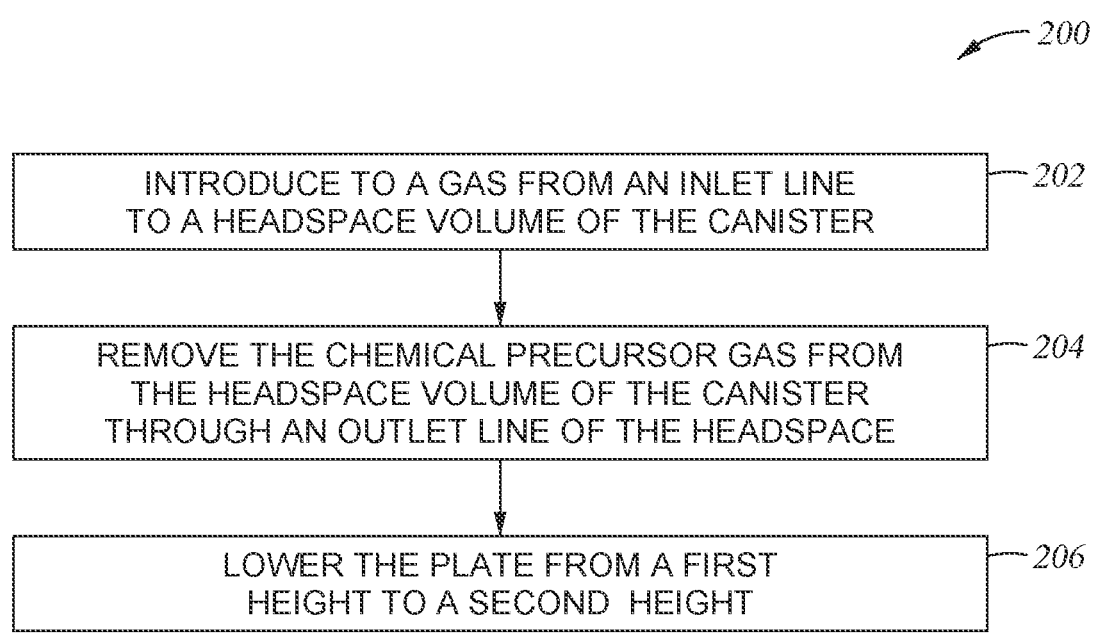
FIG. 2 illustrates a flow diagram of a method for generating gas for use in a process chamber, according to an embodiment.

FIG. 2 illustrates a flow diagram of a method 200 for generating gas for use in a process chamber 170. The method includes, in operation 202, introducing a gas from an inlet line 112 to a headspace volume 122 of a canister 100. The gas is a carrier gas, a purge gas, or other process gases. The gas may be nitrogen, hydrogen, argon, neon, helium, or combination(s) thereof. The gas is introduced to the headspace volume 122 of the canister 100 via inlet bellow 113 through an inlet opening 114 of the plate 108. Although a single inlet line 112 is provided herein, a plurality of inlet lines are also contemplated for providing additional gases for use as co-reactants and/or additional carrier gases, or alternatively for providing additional flow inlets for the same gas. Each inlet line 112 is controlled by a flow controller such as a mass flow controller or volume flow controller in communication with controller having a central processing unit (CPU) that controls flow of each of the reactants to the headspace of the canister 100. The CPU is any suitable computer processor that is used in an industrial setting for controlling various chambers and sub-processors. The CPU is coupled to a memory, such as one or more readily available memory such as random access memory (RAM), read only memory (ROM), flash memory, compact disk, floppy disk, hard disk, or any other form of local or remote digital storage. Support circuits are coupled to the CPU to support the CPU in a conventional manner. These circuits include cache, power supplies, clock circuits, input/output circuitry, subsystems, and the like.

In operation 204, a process gas is removed from the headspace volume 122 to the outlet line 118 of the canister 100. The process gas is the carrier or purge gas and including or carrying a volatilized or sublimed portion of precursor bed 121. The process gas is removed from the canister 100 and introduced to a process volume of a process chamber 170, such as a CVD process chamber. Although a single outlet line 118 is provided herein, a plurality of outlet lines are also contemplated providing precursor gases to one or more process chambers 170. Each outlet line 118 is controlled by a flow controller, similar to the flow controller described with reference to the inlet line 112 and in communication with the CPU that controls flow of each of the reactants to each of the process chambers 170.

In operation 206, the plate 108 is lowered from a first height to a second height. Lowering the plate 108 corresponds to reducing a level of the solid precursor material. The plate 108 is lowered using a device such as a force mechanism 150, and/or by gravitational force. The plate 108 lowers when an applied external force exerted by the force mechanism 150 and/or gravitational force exceeds the upward spring force of the bellows (e.g., 113, 115, 117) and total contact force (e.g., normal force) between the precursor bed 121 and the foot 142 of each of the plurality of standoffs 110. The force mechanism 150 is a pneumatic actuator or a hydraulic actuator. The force mechanism 150 is actuated in response to maintaining constant contact between the standoffs 110 and the precursor bed 121. A feature of the force mechanism 150, such as piston 154 is lowered as the plate 108 is lowered and the level detector 130 detects at least one attribute of the force mechanism, such as the position of the piston 154. In some embodiments, which can be combined with other embodiments described herein, operation 204 and operation 206 occur simultaneously. At all operations, the headspace volume 122 is maintained at the same volume. A height of the headspace volume 122 corresponds to a length of the standoffs 110 disposed between the plate 108 and the precursor bed 121. Although the figure depict bellows, other devices are also contemplated.

The method further includes determining an attribute of the force mechanism 150, such as sensing a position of the piston 154 within the pneumatic or hydraulic linear actuator. The attribute, such as position of the piston 154 corresponds to the level of the solid precursor material. Additionally, the method includes determining that the level of the solid precursor material reaches a predetermined threshold and adding additional solid precursor bed 121 to the canister 100. In some embodiments, which can be combined with other embodiments described herein, the precursor bed 121 is in the form of powder, granules, or pellets. The solid is sublimed with the application of heat at or above temperatures required to induce sublimation under vacuum pressures. In some embodiments, which can be combined with other embodiments described herein, about the solid is heated to a temperature of about 50° C. to about 250° C. The precursor is introduced through a solid refill inlet and controlled using a flow control valve.

In summation, a canister 100 is provided which can house solid precursor material therein. A plate 108 is positioned above the solid precursor within the canister 100 and is lowered at the same rate the bed of solid precursor level is lowered during consumption. The plate 108 maintains a fixed height of headspace above the solid precursor that enables uniform carrier gas flow across the surface of the precursor to provide uniform dosage of volatile gases that is delivered from the canister 100 (e.g., ampoule) to the process chamber 170 (e.g., CVD chamber). The plate 108 is further coupled to a force mechanism 150 and a level detector 130 is coupled to the force mechanism 150 to detect an attribute, such as a position of a piston 154, within the force mechanism 150. The attribute of the force mechanism, such as a piston 154 position is indicative of the level of the solid precursor bed 121 within the canister 100 and enables refilling solid precursor into the canister 100 at a threshold low level.

While the foregoing is directed to embodiments of the present disclosure, other and further embodiments of the disclosure may be devised without departing from the basic scope thereof, and the scope thereof is determined by the claims that follow.

As used herein, the term "about" refers to a +/−10% variation from the nominal value. It is to be understood that such a variation can be included in any value provided herein.

What is claimed is:

1. An apparatus comprising:
a canister having a sidewall, a top, and a bottom forming a canister volume;
an inlet line and an outlet line coupled to the top and in fluid communication with the canister volume;
a plate disposed within the canister volume forming a headspace volume below the plate, the inlet line and the outlet line each in fluid communication with the headspace volume; and
one or more standoffs extending from a lower surface of the plate, wherein the one or more standoffs comprise a lower surface area substantially parallel with the plate.

2. The apparatus of claim 1, wherein each of the one or more standoffs comprise posts extending from the lower surface of the plate to a respective foot, the foot comprising the lower surface area substantially parallel with the plate.

3. The apparatus of claim 1, further comprising an inlet bellow fluidly coupled to the inlet line and fluidly coupled to an inlet opening of the plate; and an outlet bellow fluidly coupled to the outlet line and fluidly coupled to an outlet opening of the plate.

4. The apparatus of claim 3, further comprising a support bellow coupled to the plate, the support bellow surrounding a piston rod of a linear actuator.

5. The apparatus of claim 4, further comprising a sensor configured to detect a piston position of the linear actuator, wherein the piston position corresponds to a plate position within the canister volume, and the plate position corresponds to a level of a solid precursor material disposed with the canister volume.

6. The apparatus of claim 4, wherein the inlet bellow, the outlet bellow, and support bellow extend and contract simultaneously upon lowering or raising of the plate within the canister volume.

7. The apparatus of claim 4, wherein each of the inlet bellow, the outlet bellow, and the support bellow is composed of a material selected from the group consisting of elastomeric materials, fluoroelastomers, perfluoroelastomers, polytetrafluoroethylene, stainless steel, chromium, nickel, molybdenum, and combination(s) thereof.

8. The apparatus of claim 1, wherein the plate further comprises one or more holes, wherein an upper volume formed between the top and the plate of the canister is in fluid communication with the headspace volume through the one or more holes.

9. A system for generating a process gas used in a vapor deposition process chamber, comprising:

a canister having a sidewall, a top, and a bottom forming a canister volume;

an inlet line and an outlet line coupled with and in fluid communication with the canister volume;

a plate disposed within the canister volume forming a headspace volume below the plate, the inlet line and the outlet line each in fluid communication with the headspace volume;

a solid precursor material at least partially contained within a lower region of the canister volume disposed below the headspace volume; and one or more standoffs extending from a lower surface of the plate, wherein the one or more standoffs comprise a lower surface area substantially parallel with the plate.

10. The system of claim 9, wherein each of the one or more standoffs comprise posts extending from the lower surface of the plate to a precursor surface, wherein a post height of the posts corresponds to a headspace height of the headspace.

11. The system of claim 9, further comprising a sensor configured to detect a piston position of a linear actuator coupled to the plate, wherein the piston position corresponds to a plate position within the canister volume, and the plate position corresponds to a level of the solid precursor material disposed with the canister volume.

12. The system of claim 11, wherein the sensor is disposed outside of a housing of the piston, wherein the sensor uses ultrasonic sensing or magnetic sensing.

13. The system of claim 11, wherein the linear actuator is a pneumatic or hydraulic actuator configured to apply force on the plate along a gravitational axis.

14. The system of claim 9, wherein the plate comprises a stabilizer feature extending from an upper surface of the plate proximate to an edge of the plate and configured to maintain the plate substantially level within the canister.

* * * * *